(12) United States Patent
Huang et al.

(10) Patent No.: US 10,418,575 B2
(45) Date of Patent: Sep. 17, 2019

(54) OLED WITH MIXED LAYER BETWEEN THE HOLE TRANSPORT AND EMISSION LAYERS

(71) Applicant: Wuhan China Star Optoelectronics Technology Co., Ltd., Wuhan (CN)

(72) Inventors: Jinchang Huang, Wuhan (CN); Hsianglun Hsu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 104 days.

(21) Appl. No.: 15/544,022

(22) PCT Filed: Jun. 14, 2017

(86) PCT No.: PCT/CN2017/088328
§ 371 (c)(1),
(2) Date: Jul. 17, 2017

(87) PCT Pub. No.: WO2018/201562
PCT Pub. Date: Nov. 8, 2018

(65) Prior Publication Data
US 2018/0337360 A1  Nov. 22, 2018

(30) Foreign Application Priority Data
May 3, 2017  (CN) .......................... 2017 1 0305892

(51) Int. Cl.
*H01L 51/50* (2006.01)
*H01L 51/56* (2006.01)
(Continued)

(52) U.S. Cl.
CPC ...... *H01L 51/5008* (2013.01); *H01L 27/3244* (2013.01); *H01L 51/50* (2013.01);
(Continued)

(58) Field of Classification Search
CPC ............ H01L 51/5008; H01L 27/3244; H01L 51/5012; H01L 51/5016; H01L 51/5056;
(Continued)

(56) References Cited

U.S. PATENT DOCUMENTS 5,955,836 A * 9/1999 Boerner ................ C09K 11/06
313/503
2004/0222739 A1* 11/2004 Chen .................... H01L 51/5012
313/504
(Continued)

FOREIGN PATENT DOCUMENTS

CN          1825658 A       8/2006
CN        102044634 A       5/2011
(Continued)

*Primary Examiner* — Peter Bradford
(74) *Attorney, Agent, or Firm* — Leong C. Lei

(57) ABSTRACT

The present invention provides an organic light-emitting display apparatus where an organic light-emitting device comprises an anode layer, a cathode layer, and an organic light-emitting dielectric layer disposed between the anode layer and the cathode layer; organic light-emitting dielectric layer comprises a hole injection layer, a hole transporting layer, a first mixed layer, an emission layer, an electron transporting layer, and an electron injection layer sequentially disposed; wherein first mixed layer is a mixed material layer consisting of a hole transporting material and an electron transporting material, and first mixed layer is doped with either of a material having an electron blocking function and a material having a hole control function. It can decrease injection barrier of carriers of holes and electrons in the organic light-emitting device, control carrier injection rate and position of carrier recombination region, and raise the recombination efficiency of the carriers, thereby achieving a high efficiency, long lifetime organic light-emitting device.

18 Claims, 4 Drawing Sheets

(51) Int. Cl.
*H01L 27/32* (2006.01)
*H01L 51/00* (2006.01)

(52) U.S. Cl.
CPC ...... *H01L 51/5012* (2013.01); *H01L 51/5016* (2013.01); *H01L 51/5056* (2013.01); *H01L 51/5076* (2013.01); *H01L 51/56* (2013.01); *H01L 51/006* (2013.01); *H01L 51/007* (2013.01); *H01L 51/0058* (2013.01); *H01L 51/0072* (2013.01); *H01L 51/0081* (2013.01); *H01L 51/5096* (2013.01); *H01L 2051/0063* (2013.01); *H01L 2251/558* (2013.01)

(58) Field of Classification Search
CPC . H01L 51/5076; H01L 51/5096; H01L 51/56; H01L 51/0058; H01L 51/006; H01L 51/007; H01L 51/0072; H01L 51/0081; H01L 2051/0063; H01L 2251/558
See application file for complete search history.

(56) References Cited

U.S. PATENT DOCUMENTS

| | | | | |
|---|---|---|---|---|
| 2004/0245542 | A1* | 12/2004 | Kim | H01L 51/50 257/103 |
| 2007/0099024 | A1* | 5/2007 | Nii | C09K 11/06 428/690 |
| 2008/0145520 | A1* | 6/2008 | Yumoto | H01L 51/0003 427/66 |
| 2009/0072122 | A1* | 3/2009 | Tada | H01L 27/14647 250/208.1 |
| 2009/0076322 | A1* | 3/2009 | Matsunaga | A61B 1/041 600/109 |
| 2009/0079337 | A1* | 3/2009 | Seo | H01L 51/50 313/504 |
| 2012/0286302 | A1 | 11/2012 | Mandlik | |
| 2013/0270524 | A1* | 10/2013 | Park | C07D 403/12 257/40 |
| 2015/0194624 | A1* | 7/2015 | Jeong | H01L 51/5072 257/40 |
| 2016/0149152 | A1* | 5/2016 | Kim | H01L 51/0072 257/40 |
| 2017/0237004 | A1* | 8/2017 | Molaire | H01L 51/0053 257/40 |
| 2017/0271607 | A1* | 9/2017 | Kambe | H01L 51/504 |
| 2018/0190193 | A1* | 7/2018 | Kim | G09G 3/3225 |
| 2018/0254438 | A1* | 9/2018 | Wang | H01L 51/0059 |
| 2019/0115398 | A1* | 4/2019 | Tsukamoto | H01L 27/156 |

FOREIGN PATENT DOCUMENTS

| | | |
|---|---|---|
| CN | 102842680 A | 12/2012 |
| CN | 103094483 A | 5/2013 |
| CN | 104934541 A | 9/2015 |
| CN | 106104838 A | 11/2016 |

\* cited by examiner

OLED WITH MIXED LAYER BETWEEN THE HOLE TRANSPORT AND EMISSION LAYERS

FIELD OF THE INVENTION

The present invention relates to a display technology field, and more particular to an organic light-emitting display apparatus.

BACKGROUND OF THE INVENTION

Organic light-emitting display (OLED) technology is commonly known in this field, which possesses self-luminous property with differing from the liquid crystal display (LCD) technology. OLED does not need additional backlight. Besides, OLED further has a thin thickness, light weight, driving voltage, lower power consumption, high illumination efficiency, short response time, high clarity and contrast, near 180° view angle, wide range of working temperature, applicability of flexible display and large scale full color display. OLED has been regard as the most potential display apparatus.

Organic light-emitting display apparatus are classified into two types, active type and passive type, wherein active type planar display has lots of advantages of a compact body, power saving etc., thereby achieving broad applications. The current active type organic light-emitting display apparatus principally comprises a base substrate, a thin film transistor (TFT) layer disposed above the base substrate, an organic light-emitting component disposed on the TFT layer, and an encapsulation layer disposed above the organic light-emitting component, for implementing encapsulation thereto; wherein the TFT layer serves to drive the organic light-emitting component, whereas the organic light-emitting component commonly comprises pixel electrode and common electrode which respectively act as anode and cathode, and an organic luminous functional layer disposed between the pixel electrode and the common electrode such that when proper voltage are applied onto anode and cathode, light is emitted from organic luminous functional layer. The organic luminous functional layer commonly comprises a hole injection layer disposed above the anode, a hole transporting layer disposed above the hole injection layer, an emission layer dispose above the hole transporting layer, an electron transporting layer disposed above the emission layer, an electron injection layer disposed above the electron transporting layer. Its luminous principle is that under certain voltage driving, electrons and holes are respectively injected from the cathode and a the node to the electron injection layer and the hole injection layer, electrons and holes respectively pass through the electron transporting layer and the hole transporting layer to migrate into the emission layer, and meet with each other in the emission layer, so as to form excitions to excite luminescent molecules. The latter emits visible lights through radiative relaxation.

Currently, it is essential to resolve a long-time technical issue of the organic light-emitting display apparatus that efficiency and lifetime of the organic light-emitting device are lowered.

SUMMARY OF THE INVENTION

An objective of the present invention is to provide an organic light-emitting display apparatus which collocates different-function organic compound films to decrease the injection barrier of carriers in organic light-emitting device, control the injection rate of the carriers and the location of carrier recombination region, and raise the recombination efficiency of the carriers, thereby achieving a high-efficiency, long-lifetime organic light-emitting device.

To accomplish the aforementioned objective, the present invention provides an organic light-emitting display apparatus, which comprises a substrate, and an organic light-emitting device disposed on the substrate;

said organic light-emitting device comprises a anode layer, a cathode layer, and an organic light-emitting dielectric layer disposed between the anode layer and the cathode layer;

said organic light-emitting dielectric layer comprises a hole injection layer, a hole transporting layer, a first mixed layer, an emission layer, an electron transporting layer and an electron injection layer, which are sequentially disposed on said anode layer, nearly to a side of the cathode layer;

said first mixed layer is a mixed material layer consisting of a hole transporting material and an electron transporting material, and said first mixed layer is doped with a first functional material; and said first functional material is a material having an electron blocking function, a material having a hole control function, or both thereof in combination.

Said organic light-emitting dielectric layer further comprises a second mixed layer disposed between said emission layer and the electron transporting layer; and said second mixed layer is a mixed material layer consisting of the hole transporting material and the electron transporting material.

Said second mixed layer is doped with a second functional material; and said second functional material is a material having a hole blocking function, a material having an electron control function, or both thereof in combination.

Said emission layer is a mixed material layer consisting of the hole transporting material and the electron transporting material, which is doped with a luminescent dopant therein thereby having a luminous function; and said first mixed layer, the emission layer, and the second mixed layer commonly constitute a mixed layer unit.

Said luminescent dopant is triplet excited state phosphorescent emission, singlet excited state fluorescence emission, or thermally activated delayed fluorescence emission.

In said mixed layer unit, weight percent ratios of the hole transporting material occupying in the first mixed layer, the emission layer, and the second mixed layer appear in gradient descent, weight percent ratios of the electron transporting material occupying in the first mixed layer, the emission layer, and the second mixed layer appear in gradient increscent.

A thickness of said first mixed layer is 10-500 Å, which is doped with the first functional material in a weight percent ratio of 1%-50%.

A thickness of said second mixed layer is 10-500 Å, which is doped with the second functional material in a weight percent ratio of 1%-50%.

The hole injection layer, the hole transporting layer, the first mixed layer, the emission layer, the electron transporting layer, the electron injection layer and the second mixed layer in said organic light-emitting dielectric layer all are made and formed by a vacuum deposition method, an inkjet printing method, a knife coating method, a spin coating method, or a screen printing method.

said substrate is a TFT substrate;

an anode layer, an organic light-emitting dielectric layer, and a cathode layer are, which are sequentially disposed on said substrate from bottom to top in said organic light-emitting device; or a cathode layer, an organic light-emitting dielectric layer, and an anode layer are, which are sequentially disposed on said substrate from bottom to top in said organic light-emitting device.

The present invention further provides an organic light-emitting display apparatus, which comprises a substrate, and an organic light-emitting device disposed on the substrate;

Said organic light-emitting device comprises an anode layer, a cathode layer, and an organic light-emitting dielectric layer disposed between the anode layer and the cathode layer;

Said organic light-emitting dielectric layer comprises a hole injection layer, a hole transporting layer, a first mixed layer, an emission layer, an electron transporting layer, and an electron injection layer, which are sequentially disposed on said anode layer, nearly to a side of cathode layer;

said first mixed layer is a mixed material layer consisting of a hole transporting material and an electron transporting material, and said first mixed layer is doped with a first functional material; and said first functional material is a material having an electron blocking function, a material having a hole control function, or both thereof in combination;

wherein a thickness of said first mixed layer is 10-500 Å, which is doped with the first functional material in a weight percent ratio of 1%-50%; and wherein said substrate is a TFT substrate;

in said organic light-emitting device, the anode layer, the organic light-emitting dielectric layer, and the cathode layer are sequentially disposed on said substrate from bottom to top; or in said organic light-emitting device, the cathode layer, the organic light-emitting dielectric layer and the anode layer are sequentially disposed on said substrate from bottom to top.

A beneficial effect of the present invention is that: the present invention provides an organic light-emitting display apparatus where an organic light-emitting device comprises an anode layer, a cathode layer, and an organic light-emitting dielectric layer disposed between the anode layer and the cathode layer; said organic light-emitting dielectric layer comprises a hole injection layer, a hole transporting layer, a first mixed layer, an emission layer, an electron transporting layer, and an electron injection layer sequentially disposed thereon; wherein said first mixed layer is a mixed material layer consisting of a hole transporting material and an electron transporting material, and said first mixed layer is doped with either of a material having an electron blocking function and a material having a hole control function. It can decrease injection barrier of carriers of holes and electrons in the organic light-emitting device, control carrier injection rate and position of carrier recombination region, and raise the recombination efficiency of the carriers, thereby achieving a high efficiency, long lifetime organic light-emitting device.

For better realizing the characteristic and the technical context of the present invention, please refer to the detailed description in regard to the present invention with the accompanying drawings; however, the accompanying drawings just for reference and explanation but not for limitation to the present invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
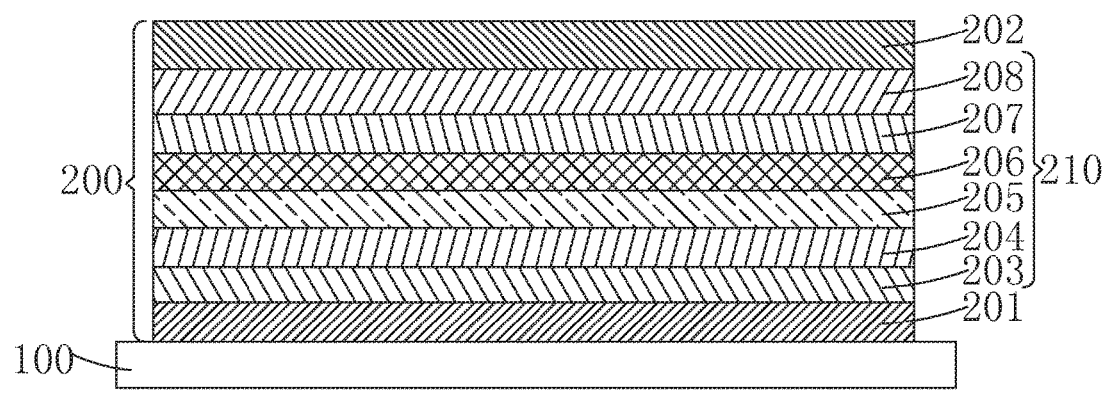
FIG. 1 is a structural schematic diagram of a first embodiment of an organic light-emitting display apparatus of the present invention.

Referring to FIG. 1, which is a structural schematic diagram of a first embodiment of an organic light-emitting display apparatus of the present invention, said organic light-emitting display apparatus comprises a substrate 100, and an organic light-emitting device 200 disposed on the substrate 100;

said organic light-emitting device 200 comprises an anode layer 201, a cathode layer 202, and an organic light-emitting dielectric layer 210 between disposed on the anode layer 201 and the cathode layer 202;

said organic light-emitting dielectric layer 210 comprises a hole injection layer 203, a hole transporting layer 204, a first mixed layer 205, an emission layer 206, an electron transporting layer 207 and an electron injection layer 208, which are sequentially disposed on said anode layer 201, nearly to a side of the cathode layer 202;

said first mixed layer 205 is a mixed material layer consisting of a hole transporting material and an electron transporting material, and said first mixed layer 205 is doped with a first functional material; said first functional material is a material having an electron blocking function, a material having a hole control function, or both thereof in combination; namely, said first mixed layer 205 can be doped thereinto with a material having the electron blocking function, for blocking injected electrons from passing through the emission layer 206 from the cathode 202 to reach a side of the hole transporting layer 204; or said first mixed layer 205 can be also doped thereinto with a material having the hole control function, for controlling a rate of injecting the hole carriers from the hole transporting layer 204 to the emission layer 206; or said first mixed layer 205 can be also doped thereinto with a material having the electron blocking function and a material having the hole control function at the same time, so as to accomplish blocking injected electrons from passing through the emission layer 206 from the cathode 202 to reach a side of the hole transporting layer 204, and for controlling a rate of injecting the hole carriers from the hole transporting layer 204 to the emission layer 206 at the same time.

Specifically, in said first mixed layer 205, a material having the electron blocking function has the highest Occupied Molecular Orbital (HOMO) and the lowest Unoccupied Molecular Orbital (LUMO) energy level difference greater than those of the hole transporting material and the electron transporting material; a material having the hole control function has a hole transport rate slower than that of a hole transporting material.

Specifically, in said first mixed layer 205, the hole transporting material can be a triarylamine substance and its derivatives. For example, N,N'-diphenyl-N,N'-bis(3-methyl-phenyl)-1,1'-biphenyl-4,4'-diamine (as abbreviated to 'TPD'), 4,4'-bis[N-(1-naphthyl)-N-phenyl-amino]biphenyl (as abbreviated to 'NPB'), or 4,4'-N,N'-dicarbazole-biphenyl (as abbreviated to 'CPB') and so forth; the electron transporting material can be a metallic complex, or an organic aromatic ring compound containing double bonds N. For example, tris (8-hyroxyquinolinato) aluminum (III) (as abbreviated to 'Alq3'), 2-(4'-tert-butylphenyl)-5-(4"-biphenyl)-1, 3, 4-oxadiazole (as abbreviated to 'PBD'), or 4,7-diphenyl-1,10-phenanthroline (as abbreviated to 'BPhen') etc.

Specifically, a thickness of said first mixed layer 205 is 10-500 Å, which is doped with the first functional material in a weight percent ratio of 1%-50%; namely, while said first functional doped material is a material having the electron blocking function, said material having the electron blocking function has a weight percent ratio of 1%-50% doped into the first mixed layer 205; while said first functional doped material is a material having the hole control function, said material having the hole control function has a weight percent ratio of 1%-50% doped into the first mixed layer 205; while said first functional doped material is a combination of a material having the electron blocking function and a material having the hole control function, said material having the electron blocking function and the material having the hole control function all have a weight percent ratio of 1%-50% doped into the first mixed layer 205, a weight percent ratio of the sum of both thereof in the first mixed layer 205 is also 1%-50%.

Specifically, a material of said hole transporting layer 204 has a hole transporting function, a material of said hole injection layer 203 has a hole injecting function, a material of said hole transporting layer 204 has a higher or identical ionization potential than a material of said hole injection layer 203.

Specifically, the hole transporting material in said first mixed layer 205 and a material of said hole transporting layer 204 can be either the same or different; the electron transporting material in said first mixed layer 205 and a material of said electron transporting layer 207 can be either the same or different.

Specifically, said substrate 100 is a TFT substrate; said substrate 100 can be either a rigid substrate or a flexible substrate.

Specifically, said organic light-emitting device 200 can be an upright device, wherein the anode layer 201, the organic light-emitting dielectric layer 210, and the cathode layer 202 are sequentially disposed on said substrate 100 from bottom to top; the hole injection layer 203 in said organic light-emitting dielectric layer 210 is made and formed above the anode layer 201 on said substrate 100 by a vacuum deposition method (Vacuum Evaporation), an inkjet printing method (Ink-jet Printing), a knife coating method (Blade Coating), a spin coating method (Spin-Coating), a screen printing method (Screen Printing) etc. method, it preferably alters vacuum deposition method for making formation of the hole injection layer 203 with micromolecule material.

Specifically, the other organic compound film, the hole transporting layer 204, the first mixed layer 205, the emission layer 206, the electron transporting layer 207, and the electron injection layer 208 in said organic light-emitting dielectric layer 210 are also made and formed by the fabricating method as making the hole injection layer 203, all of which can be made and formed by the vacuum deposition method, the inkjet printing method, the knife coating method, the spin coating method or the screen printing method.

Alternatively, said organic light-emitting device 200 can be also an inverted device, wherein the cathode layer 202, the organic light-emitting dielectric layer 210, and the anode layer 201 are sequentially disposed on said substrate 100 from bottom to top.

Specifically, said organic light-emitting device 200 can be a red, green, blue, and the colour organic light-emitting devices.

Specifically, said organic light-emitting device 200 can be either a bottom-emission light-emitting device that emits light from the substrate 100, or also a top-emission light-emitting device that emits light from a side departed away from the substrate 100.

The organic light-emitting display apparatus of the present invention, by collocating different-function organic compound films in the organic light-emitting device 200, decreases injecting barrier of carriers (holes and electrons) in the organic light-emitting device, controls carrier injection rate and position of carrier recombination region, and raises the recombination efficiency of the carriers, thereby achieving a high efficiency, long lifetime organic light-emitting device 200.

Figure 2:
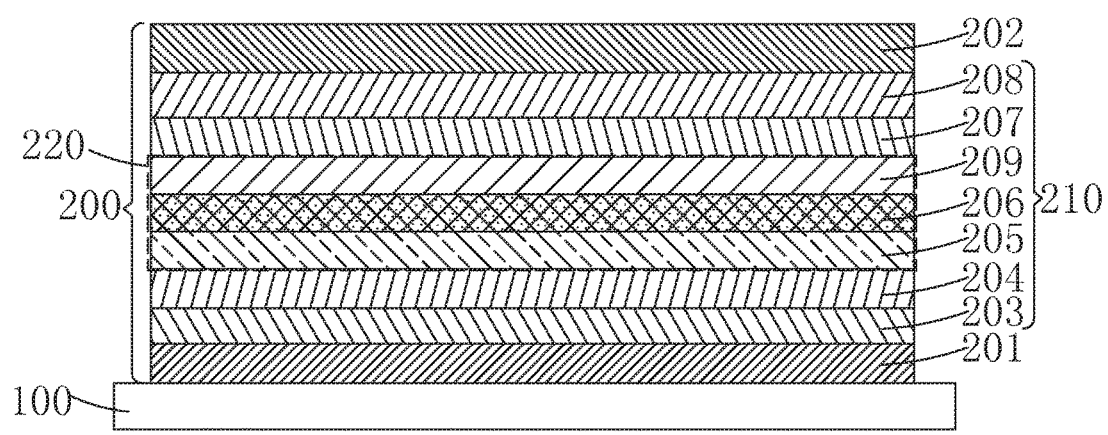
FIG. 2 is a structurally schematic diagram of a second embodiment of an organic light-emitting display apparatus of the present invention.

Referring to FIG. 2, which is a structurally schematic diagram of a second embodiment of an organic light-emitting display apparatus of the present invention. This embodiment is contrasted with the aforementioned first embodiment in that, said organic light-emitting dielectric layer 210 further comprises a second mixed layer 209 disposed between said emission layer 206 and the electron transporting layer 207; said second mixed layer 209, as well as said first mixed layer 205, is also a mixed material layer consisting of the hole transporting material and the electron transporting material. Said emission layer 206 as the same is also a mixed material layer consisting of the hole transporting material and the electron transporting material, which is doped thereinto with a luminescent dopant thereby having a luminous function; whereby said first mixed layer 205, the emission layer 206 and the second mixed layer 209 commonly constitute a mixed layer unit 220, which respectively serve to a first section, a second section and a third section in said mixed layer unit 220.

Specifically, a luminescent dopant in said emission layer 206 is triplet excited state phosphorescent emission, singlet excited state fluorescence emission or thermally activated delayed fluorescence emission.

Specifically, in said mixed layer unit 220, from the first mixed layer 205 to the second mixed layer 209, that is also, in a direction from the hole transporting layer 204 to the electron transporting layer 207, weight percent ratios of the hole transporting material occupying in the first mixed layer 205, the emission layer 206 and the second mixed layer 209 appear in gradient descent, and weight percent ratios of the electron transporting material occupying in the first mixed layer 205, the emission layer 206, and the second mixed layer 209 appear in gradient increscent.

Specifically, the hole transporting material of said emission layer 206 and the second mixed layer 209, and a material of said hole transporting layer 204 can be either the same or different; the electron transporting material of said emission layer 206 and the second mixed layer 209, and a material of said electron transporting layer 207 can be either the same or different.

Specifically, a thickness of said second mixed layer 209 is 10-500 Å.

Specifically, the hole transporting material in said emission layer 206 and the second mixed layer 209 can be TPD, NPB or CPB and so on; the electron transporting material can be Alq3, PBD or BPhen and so on.

Figure 3:
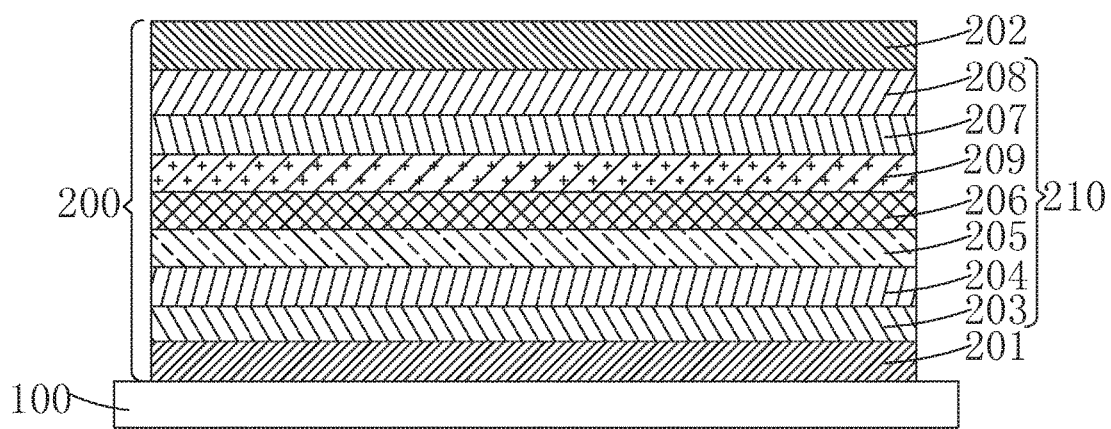
FIG. 3 is a structurally schematic diagram of a third embodiment of organic light-emitting display apparatus of the present invention.

Referring to FIG. 3, which is a structurally schematic diagram of a third embodiment of an organic light-emitting display apparatus of the present invention. This embodiment is contrasted with the aforementioned first embodiment in that, said organic light-emitting dielectric layer 210 further comprises a second mixed layer 209 disposed between said emission layer 206 and the electron transporting layer 207; and said second mixed layer 209 is doped with a second functional material; said second functional material is a material having a hole blocking function, a material having an electron control function, or both thereof in combination; namely, said second mixed layer 209 can be doped thereinto with a material having a hole blocking function, for blocking injected hole from passing through the emission layer 206 from the anode 201 to reach a side of the electron transporting layer 207; or said second mixed layer 209 can also be doped thereinto with a material having an electron control function, for controlling a rate of injecting the electron carriers from the electron transporting layer 207 to the emission layer 206; or furthermore said second mixed layer 209 can be also doped thereinto with a material having a hole blocking function and a material having an electron control function at the same time, for blocking injected holes from passing through the emission layer 206 from the anode 201 to reach a side of the electron transporting layer 207, and for controlling a rate of injecting the electron carriers from electron transporting layer 207 to the emission layer 206 at the same time.

Specifically, in said second mixed layer 209, a material having a hole blocking function has the highest Occupied Molecular Orbital and the lowest Unoccupied Molecular Orbital energy level difference, greater than those of the hole transporting material and the electron transporting material, a material having an electron control function has a electron transport rate slower than that of an electron transporting material.

Specifically, the hole transporting material and a material of said hole transporting layer 204 in said second mixed layer 209 can be either the same or different; the electron transporting material and a material of said electron transporting layer 207 in said second mixed layer 209 can be either the same or different.

Specifically, a thickness of said second mixed layer 209 is 10-500 Å, which is doped with the second functional material in a weight percent ratio of 1%-50%; namely, while said second functional doped material is a material having a hole blocking function, said material having a hole blocking function has a weight percent ratio of 1%-50% doped into the second mixed layer 209; while said second functional doped material is a material having an electron control function, said material having an electron control function has a weight percent ratio of 1%-50% doped into the second mixed layer 209; while said second functional doped material is combination of a material having a hole blocking function and a material having an electron control function, said material having a hole blocking function and the material having an electron control function all have a weight percent ratio of 1%-50% doped into the second mixed layer 209, a weight percent ratio of the sum of both thereof in the second mixed layer 209 is also 1%-50%.

Figure 4:
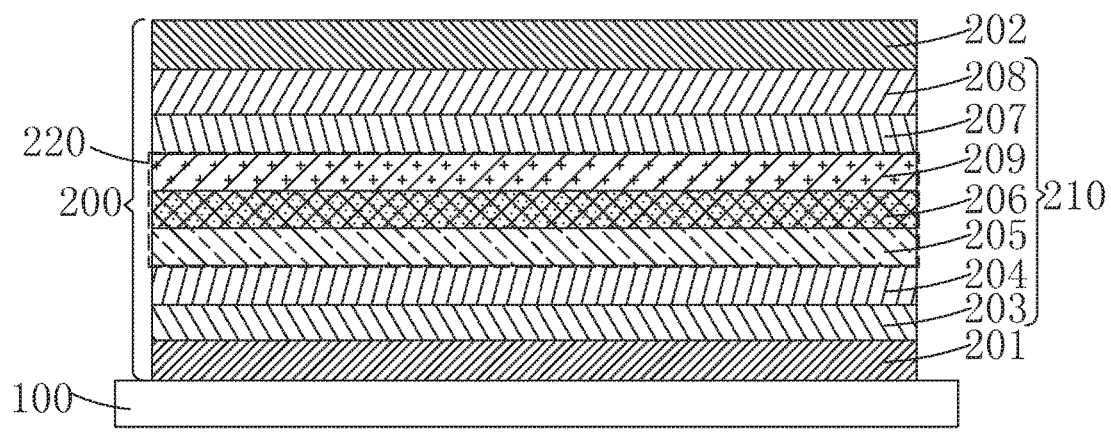
FIG. 4 is a structurally schematic diagram of a fourth embodiment of an organic light-emitting display apparatus of the present invention.

Referring to FIG. 4, which is a structurally schematic diagram of a fourth embodiment of an organic light-emitting display apparatus of the present invention. This embodiment is contrasted with the aforementioned second embodiment in that, said second mixed layer 209 is doped with the second functional material; said second functional material is a material having a hole blocking function, a material having an electron control function, or both thereof in combination; namely, said second mixed layer 209 can be doped thereinto with a material having a hole blocking function, for blocking the injected holes from passing through the emission layer 206 from the anode 201 to reach a side of the electron transporting layer 207; or said second mixed layer 209 can also be doped thereinto with a material having an electron control function, for controlling a rate of injecting the electron carriers from electron transporting layer 207 to the emission layer 206; or furthermore said second mixed layer 209 can be also doped thereinto with a material having a hole blocking function and a material having an electron control function at the same time, for blocking the injected holes from passing through the emission layer 206 from the anode 201 to reach a side of the electron transporting layer 207, and for controlling a rate of injecting the electron carriers from the electron transporting layer 207 to the emission layer 206, at the same time.

Specifically, in said second mixed layer 209, a material having a hole blocking function has the highest Occupied Molecular Orbital and the lowest Unoccupied Molecular Orbital energy level difference, greater than those of the hole transporting material and the electron transporting material, a material having an electron control function has an electron transport rate slower than electron transporting material.

Specifically, the hole transporting material in said emission layer 206 and said second mixed layer 209, and a material of said hole transporting layer 204 can be either the same or different; the electron transporting material in said emission layer 206, and said second mixed layer 209, and a material of said electron transporting layer 207 can be either the same or different.

Specifically, said second mixed layer 209 is doped thereinto with the second functional material in a weight percent ratio of 1%-50%.

In conclusion, an organic light-emitting display apparatus is provided by the present invention, where an organic light-emitting device comprises an anode layer, a cathode layer, and an organic light-emitting dielectric layer disposed between the anode layer and the cathode layer; said organic light-emitting dielectric layer comprises a hole injection layer, a hole transporting layer, a first mixed layer, an emission layer, an electron transporting layer, and an electron injection layer sequentially disposed thereon; wherein said first mixed layer is a mixed material layer consisting of a hole transporting material and an electron transporting material, and said first mixed layer is doped with either of a material having an electron blocking function and a material having a hole control function; it can decrease injection barrier of carriers of holes and electrons in the organic light-emitting device, control carrier injection rate and position of carrier recombination region, and raise the recombination efficiency of the carriers, thereby achieving a high efficiency, long lifetime organic light-emitting device.

As above mentioned, in accordance with technical embodiments and technical solution of the present invention, to any persons who are ordinary skilled in the art, other related change or variances can be made which should be covered by the protected scope of the subject claims attached below by the present invention.

What is claimed is:

1. An organic light-emitting display apparatus comprising a substrate, and an organic light-emitting device disposed on the substrate;
    said organic light-emitting device comprising an anode layer, a cathode layer, and an organic light-emitting layer disposed between the anode layer and the cathode layer;
    said organic light-emitting layer comprising a hole injection layer, a hole transporting layer, a first mixed layer, an emission layer, an electron transporting layer, and an electron injection layer, which are sequentially disposed on one side of the anode layer that is adjacent to the cathode layer;
    said first mixed layer being a mixed material layer comprising a hole transporting material and an electron transporting material, said first mixed layer being doped with a first functional material; and
    said first functional material being a material having an electron blocking function, a material having a hole control function, or both.

2. The organic light-emitting display apparatus as claimed in claim 1, wherein said organic light-emitting layer further comprises a second mixed layer disposed between said emission layer and the electron transporting layer; and
    said second mixed layer is a mixed material layer comprising a hole transporting material and an electron transporting material.

3. The organic light-emitting display apparatus as claimed in claim 2, wherein said second mixed layer is doped with a second functional material; and
    said second functional material is a material having a hole blocking function, a material having an electron control function, or both.

4. The organic light-emitting display apparatus as claimed in claim 2, wherein said emission layer is a mixed material layer comprising a hole transporting material and an electron transporting material, which is doped with a luminescent dopant thereby having a luminous function; and
    said first mixed layer, the emission layer, and the second mixed layer collectively form a unit.

5. The organic light-emitting display apparatus as claimed in claim 4, wherein said luminescent dopant comprises one of a triplet excited state phosphorescent emission material, a singlet excited state fluorescence emission material, and a thermally activated delayed fluorescence emission material.

6. The organic light-emitting display apparatus as claimed in claim 4, wherein in the unit comprising the first mixed layer, the emission layer, and the second mixed layer, weight percentages of the hole transporting material in the first mixed layer, the emission layer and the second mixed layer decrease in sequence from the first mixed layer to the second mixed layer, and weight percentages of the electron transporting material in the first mixed layer, the emission layer and the second mixed layer increase in sequence from the first mixed layer to the second mixed layer.

7. The organic light-emitting display apparatus as claimed in claim 1, wherein a thickness of said first mixed layer is 10-500 Å, which is doped with the first functional material in a weight percent of 1%-50%.

8. The organic light-emitting display apparatus as claimed in claim 2, wherein a thickness of said second mixed layer is 10-500 Å, which is doped with the second functional material in a weight percent of 1%-50%.

9. The organic light-emitting display apparatus as claimed in claim 2, wherein in said organic light-emitting layer, the hole injection layer, the hole transporting layer, the first mixed layer, the emission layer, the electron transporting layer, the electron injection layer, and the second mixed layer all are formed by a vacuum deposition method, an inkjet printing method, a knife coating method, a spin coating method, or a screen printing method.

10. The organic light-emitting display apparatus as claimed in claim 1, wherein said substrate is a TFT substrate;
    in said organic light-emitting device, the anode layer, the organic light-emitting layer, and the cathode layer are sequentially disposed on said substrate from bottom to top; or
    in said organic light-emitting device, the cathode layer, the organic light-emitting layer, and the anode layer are sequentially disposed on said substrate from bottom to top.

11. An organic light-emitting display apparatus comprising a substrate, and an organic light-emitting device disposed on the substrate;
    said organic light-emitting device comprising an anode layer, a cathode layer, and an organic light-emitting layer disposed between the anode layer and the cathode layer;
    said organic light-emitting layer comprising a hole injection layer, a hole transporting layer, a first mixed layer, an emission layer, an electron transporting layer, and an electron injection layer, which are sequentially disposed on one side of the anode layer that is adjacent to the cathode layer;
    said first mixed layer being a mixed material layer comprising a hole transporting material and an electron transporting material, said first mixed layer being doped with a first functional material; and
    said first functional material is a material having an electron blocking function, a material having a hole control function, or both;
    wherein a thickness of said first mixed layer is 10-500 Å, which is doped with the first functional material in a weight percent of 1%-50%; and
    wherein said substrate is a TFT substrate;
    in said organic light-emitting device, the anode layer, the organic light-emitting layer, and the cathode layer are sequentially disposed on said substrate from bottom to top; or
    in said organic light-emitting device, the cathode layer, the organic light-emitting layer, and the anode layer are sequentially disposed on said substrate from bottom to top.

12. The organic light-emitting display apparatus as claimed in claim 11, wherein said organic light-emitting layer further comprises a second mixed layer disposed between said emission layer and the electron transporting layer; and
    said second mixed layer is a mixed material layer comprising a hole transporting material and an electron transporting material.

13. The organic light-emitting display apparatus as claimed in claim 12, wherein said second mixed layer is doped with a second functional material; and said second functional material is a material having a hole blocking function, a material having an electron control function, or both.

14. The organic light-emitting display apparatus as claimed in claim 12, wherein said emission layer is a mixed material layer comprising a hole transporting material and an electron transporting material, which is doped with a luminescent dopant thereby having a luminous function; and
said first mixed layer, the emission layer, and the second mixed layer collectively form a unit.

15. The organic light-emitting display apparatus as claimed in claim 14, wherein said luminescent dopant comprises one of a triplet excited state phosphorescent emission material, a singlet excited state fluorescence emission material, and a thermally activated delayed fluorescence emission material.

16. The organic light-emitting display apparatus as claimed in claim 14, wherein in the unit comprising the first mixed layer, the emission layer, and the second mixed layer, weight percentages of the hole transporting material in the first mixed layer, the emission layer and the second mixed layer decrease in sequence from the first mixed layer to the second mixed layer, and weight percentages of the electron transporting material in the first mixed layer, the emission layer and the second mixed layer increase in sequence from the first mixed layer to the second mixed layer.

17. The organic light-emitting display apparatus as claimed in claim 12, wherein a thickness of said second mixed layer is 10-500 Å, which is doped with the second functional material in a weight percent of 1%-50%.

18. The organic light-emitting display apparatus as claimed in claim 12, wherein in said organic light-emitting layer, the hole injection layer, the hole transporting layer, the first mixed layer, the emission layer, the electron transporting layer, the electron injection layer and the second mixed layer all are formed by a vacuum deposition method, an inkjet printing method, a knife coating method, a spin coating method, or a screen printing method.

* * * * *